United States Patent [19]

Yamamoto et al.

[11] Patent Number: 5,329,354
[45] Date of Patent: Jul. 12, 1994

[54] ALIGNMENT APPARATUS FOR USE IN EXPOSURE SYSTEM FOR OPTICALLY TRANSFERRING PATTERN ONTO OBJECT

[75] Inventors: Masaki Yamamoto, Tokyo; Keishi Kubo, Osaka; Takeo Satoh, Kawasaki; Ushio Sangawa, Kawasaki; Hiroyuki Takeuchi, Kawasaki, all of Japan

[73] Assignee: Matsushita Electric Industrial Co., Ltd., Osaka, Japan

[21] Appl. No.: 872,216

[22] Filed: Apr. 22, 1992

[30] Foreign Application Priority Data

| Apr. 24, 1991 | [JP] | Japan | 3-094427 |
| Jan. 30, 1992 | [JP] | Japan | 4-015525 |
| Jan. 30, 1992 | [JP] | Japan | 4-015526 |

[51] Int. Cl.⁵ .................... G01B 9/02; G01B 11/00
[52] U.S. Cl. .................... 356/349; 356/351; 356/363
[58] Field of Search ............ 356/349, 358, 363, 400, 356/351

[56] References Cited

U.S. PATENT DOCUMENTS

| 4,402,610 | 9/1983 | Lacombat | 356/363 X |
| 4,636,077 | 1/1987 | Nomura et al. | 356/400 X |
| 4,659,225 | 4/1987 | Takahashi | 356/358 |
| 4,669,866 | 6/1987 | Phillips | 356/358 X |
| 4,710,026 | 12/1987 | Magome et al. | 356/349 |
| 4,814,829 | 3/1989 | Kosugi et al. | 355/43 |
| 4,828,392 | 5/1989 | Nomura et al. | 356/363 X |
| 4,870,452 | 9/1989 | Tanimoto et al. | 356/349 X |
| 5,151,749 | 9/1992 | Tanimoto et al. | 356/358 X |
| 5,184,196 | 2/1993 | Nakagawa et al. | 356/363 X |
| 5,191,465 | 3/1993 | Yamashita et al. | 356/363 X |
| 5,202,748 | 4/1993 | MacDonald et al. | 356/363 X |

FOREIGN PATENT DOCUMENTS

| 0190923 | 8/1986 | European Pat. Off. |
| 60-107617 | 6/1985 | Japan . |
| 60-129632 | 7/1985 | Japan . |
| 63-780044 | 4/1988 | Japan . |
| 8302329 | 7/1983 | PCT Int'l Appl. . |

Primary Examiner—Robert J. Warden
Assistant Examiner—Robert Carpenter
Attorney, Agent, or Firm—Lowe, Price, LeBlanc & Becker

[57] ABSTRACT

An alignment apparatus for use in an exposure system for exposing fine patterns on a wafer, the alignment apparatus comprising a light source optical system for emitting coherent alignment light, a positional deviation detecting optical system for receiving the alignment light reflected from the wafer, and a light-receiving optical system for detecting a positional deviation of the wafer on the basis of the alignment light received by the positional deviation detecting optical system. These three optical systems are arranged to be coupled through flexible optical fibers to each other. This coupling arrangement using the flexible optical fiber can reduce the size of the positional deviation detecting optical system whereby the positional deviation detecting optical system can be disposed directly under a projection lens of the exposure system, thereby accurately effecting the alignment of the wafer with respect to the projection lens.

25 Claims, 7 Drawing Sheets

ALIGNMENT APPARATUS FOR USE IN EXPOSURE SYSTEM FOR OPTICALLY TRANSFERRING PATTERN ONTO OBJECT

BACKGROUND OF THE INVENTION

The present invention relates to exposure systems for optically transferring patterns onto an object such as a wafer through a projection optical system, and more particularly to an alignment apparatus suitable for such an exposure system.

For manufacturing a semiconductor device, the overlapping exposure processes of a number of fine patterns having sizes below 0.5 μm are required with respect to a wafer. An important problem in such exposure processes relates to the need for alignment between the number of fine patterns which requires the accuracy below 0.1 μm. One known approach to resolution is disposed in the Japanese Patent Provisional Publication No. 63-78004 where a pair of first gratings on a reticle divide alight beam from a light source into a plurality of beams to selectively obtain a predetermined spectrum to project it onto a pair of second gratings on a wafer, and the second gratings are further exposed to two light beams so as to obtain two diffraction lights due to interference so that the two diffraction lights are compared in intensity with each other to effect the alignment between the reticle and the wafer.

However, there is a problem which arises with such an alignment arrangement in that the arrangement is effective only in the case that a projection optical system has high imaging performances with respect to both the exposure light and alignment light. For example, the glass material for constituting a refraction optical system is restricted in the case of using the ultraviolet light due to an excimer laser or the like as the exposure light and hence difficulty is encountered to constitute an achromatic projection optical system in which the chromatic aberration is corrected. Thus, the chromatic-aberration-corrected achromatic projection optical system is designed to sufficiently effect the color correction only in terms of the exposure light wavelength, thereby making it difficult to constitute the alignment system where the alignment light passes through a projection lens because an extremely great chromatic aberration occurs in terms of light with different wavelengths. If arranging the alightment system such that the alignment light does not pass through the projection lens, the projection lens is required to be arranged to cover the wafer whereby the exposure position of the wafer is greatly separated from the alignment position to lower the overlapping accuracy between a number of fine patterns.

SUMMARY OF THE INVENTION

It is therefore an object of the present invention to provide an exposure apparatus which is capable of allowing the size-reduction of an alignment optical system to permit it to be placed between a projection lens and an object on an image-formation surface to thereby accurately effect the alignment of the object by the alignment optical system.

In accordance with the present invention, there is provided an alignment apparatus for aligning an object at a predetermined position, comprising: a light source optical system for emitting coherent alignment light; a first optical system for leading the alignment light emitted from the light source optical system to the object; a positional deviation detecting optical system for receiving the alignment light from the object which includes beat light indicative of positional deviation information of the object; a light-receiving optical system for receiving the alignment light from the positional deviation detecting optical system to detect an amount of the positional deviation of the object on the basis of the beat light; a second optical system provided between the positional deviation detecting optical system and the light-receiving optical system for leading the alignment light from the positional deviation detecting optical system to the light-receiving optical system; and moving means for moving the object on the basis of the positional deviation amount detected by the light-receiving optical system, wherein each of the first and second optical systems comprises a flexible light guide passage. The first optical system comprises a polarization plane holding optical fiber having a function to hold a polarization direction of the alignment light and the second optical system comprises a multi-mode optical fiber having a core whose diameter is greater than a core of the polarization plane holding optical fiber or comprises a polarization plane holding optical fiber having a function to hold a polarization direction of the alignment light and the second optical system comprises an image transmitting optical fiber having a function to input the alignment light at one end and transmit the inputted alignment light to the other end as it is.

Further, according to this invention, there is provided an apparatus for exposing a reticle with respect to a wafer, comprising: an exposure system including: an exposure light source for emitting exposure light toward the reticle; and a projection optical system for receiving the exposure light outgone from the reticle so as to project an image corresponding to the reticle onto the wafer; a light source optical system disposed at a position separated from the exposure system to emit coherent alignment light; a first optical system for leading the alignment light from the light source optical system to the wafer; a positional deviation detecting optical system for receiving the alignment light from the wafer which includes beat light indicative of positional deviation information of the wafer, the positional deviation detecting optical system being substantially disposed between the projection optical system and the wafer; a light-receiving optical system disposed at a position separated from the exposure system for receiving the alignment light from the positional deviation detecting optical system to detect an amount of the positional deviation of the object on the basis of the beat light; a second optical system provided between the positional deviation detecting optical system and the light-receiving optical system for leading the alignment light from the positional deviation detecting optical system to the light-receiving optical system; and moving means for moving the object on the basis of the positional deviation amount detected by the light-receiving optical system. The exposure light and the alignment light are respectively incident on first and second areas of a surface of the wafer which are separated from each other or which are partially overlapped with each other.

Preferably, the positional deviation detecting optical system comprises means for obtaining a variation of an optical path length of the polarization plane holding optical fiber due to a disturbance, the variation obtaining means including beam sampling means disposed at an incident angle different from 90° with respect to an optical path of the alignment light from the polarization plane holding fiber for sampling the alignment light and reference beat light obtaining means disposed at an incident angle different from 90° with respect to an optical path of the sampled alignment light for obtaining reference beat light from the alignment light. Further, the light source optical system comprises a light source for generating the coherent alignment light having one frequency and modulating means for modulating the one-frequency alignment light so that the alignment light has at least two frequencies, the modulating means including at least first and second modulating elements coupled in series to each other, the first modulating element branching the alignment light into two portions to modulate one of the branched portions to provide the alignment light having a first frequency, and the second modulating element branching the other portion of the alignment light into at least two portions to modulate at least one of the branched portions to the alignment light having a second frequency or the modulating means including at least first and second modulating elements coupled in parallel to each other and branching means for branching the alignment light into at least two portions so that one of the branched portions is incident on the first modulating element to modulate the branched portion to provide the alignment light having a first frequency and the other branched portion is incident on the second modulating element to modulate the other branched portion to provide the alignment light having a second frequency.

BRIEF DESCRIPTION OF THE DRAWINGS

The object and features of the present invention will become more readily apparent from the following detailed description of the preferred embodiments taken in conjunction with the accompanying drawings in which.

DETAILED DESCRIPTION OF THE INVENTION

Figure 1:
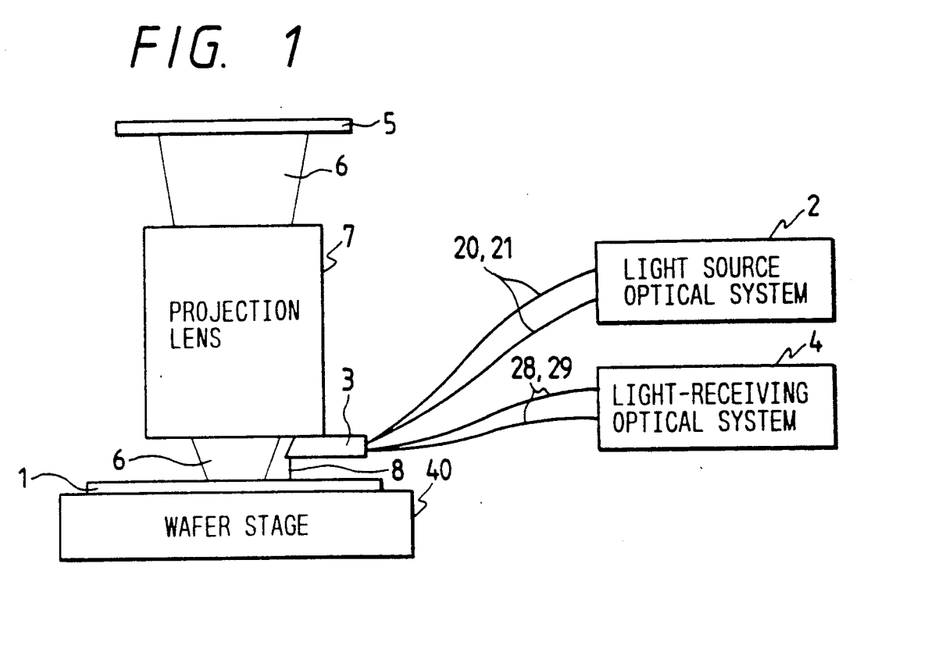
FIG. 1 is a schematic illustration of a basic arrangement of an X-axis direction alignment system in an exposure apparatus according to the present invention.
Figures 4, 5:
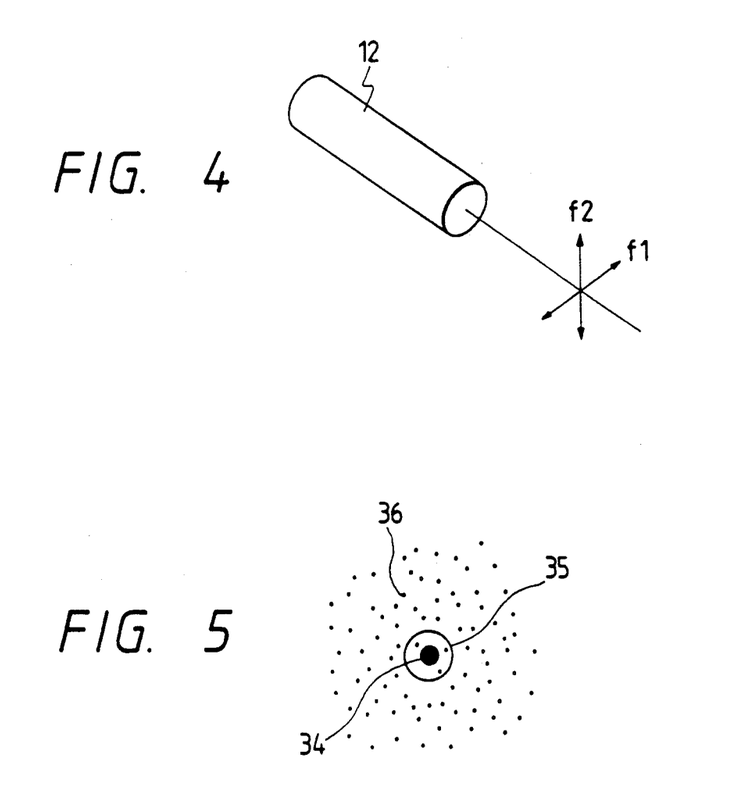
FIG. 4 is an illustration for describing a polarization state of alignment light from a laser light source in the first embodiment.
FIG. 5 is an illustration for describing an effect of a collimator lens in the first embodiment which acts as a spatial filter.

Referring now to FIG. 1 there is schematically illustrated an arrangement of an X-axis direction alignment system of three-axis (X, Y, $\theta$) direction alignment systems in an exposure apparatus according to a first embodiment of the present invention. In FIG. 1, an alignment optical system comprises a light source optical system 2 for generating an alignment light 8, a positional deviation detecting optical system 3 for leading the alignment light 8 onto a wafer 1 to be aligned, and a light-receiving optical system 4 for receiving the alignment light 8 including positional deviation information of the wafer 1. The three optical systems are coupled through polarization plane holding optical fibers 20, 21 and multimode optical fibers 28, 29. The polarization plane holding optical fibers 20, 21 are first flexible optical fibers for coupling the light source optical system 2 to the positional deviation detecting optical system 3 and the multi-mode optical fibers 28, 29 are second flexible optical fibers for coupling the positional deviation detecting optical system 3 to the light-receiving optical system 4. Further, designated at numeral 7 is a projection lens for forming on the wafer 1 an image corresponding to a pattern on a reticle 5 which is illuminated with exposure light 6. Here, although the distance between the projection lens 7 and the reticle 5 is arranged to be long and the distance between the projection lens 7 and the wafer 1 is arranged to be short because the image-formation system is generally a reduction optical system of about 5:1, according to this embodiment the positional deviation detecting optical system 3 can extremely be reduced in size so as to be placed directly bellow the projection lens 7. As shown in FIG. 4, the light source optical system 2 includes a laser light source 12 which generates coherent light having frequencies f1 and f2 orthogonally polarized. In this embodiment a Zeeman laser is used which is capable of providing two-frequency waves by applying a magnetic field to a laser tube. Further, as the light source optical system 2 it is appropriate to use an optical modulator utilizing an ultrasonic wave propagating in one direction or an optical system where a light source for generating one-frequency coherent light is provided so that the coherent light is divided into two light beams and an optical device is provided to slightly change the light frequency in accordance with the Doppler effect so as to give a difference between the frequencies of the two light beams. Here, generally the frequency difference between the frequencies f1 and f2 is several tens kHz to several tens MHz.

Figure 3:
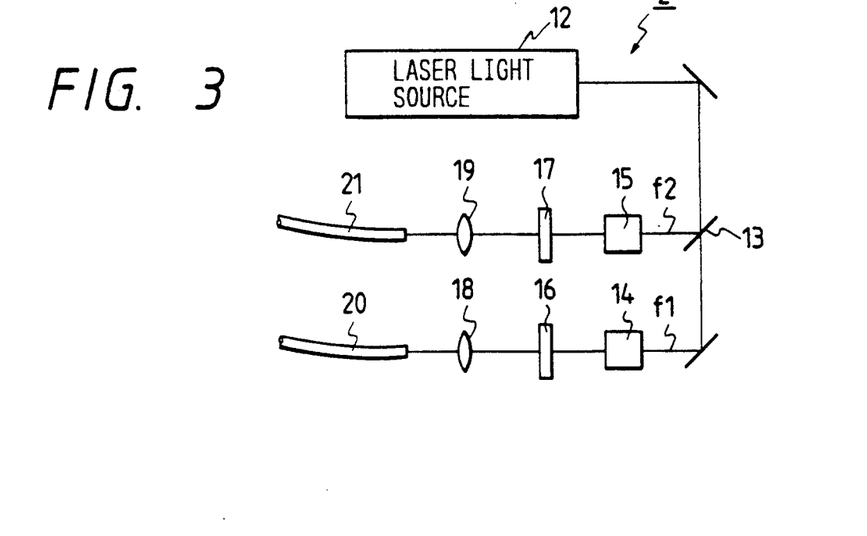
FIG. 3 is a schematic illustration of a light source optical system of an alignment apparatus according to the first embodiment of this invention.

The light source optical system 2 will be described hereinbelow with reference to FIG. 3. In FIG. 3, the light with frequencies f1 and f2 (which will be referred hereinafter to as alignment light f1 and f2) emitted from the laser light source 12 is divided into the f1 component and the f2 component by a polarization optical element 13 and then polarized in specific directions by ($\lambda$/2) wave plates 16 and 17. For the division polarization optical element 13, it is possible to use a device such as a polarization beam splitter constructed as a dielectric multi-layer assembly or a device such as a Wollaston prism based upon the multiple refraction effect. Here, the wave plates 16 and 17 rotate the polarization direction. This rotation is for the polarization directions of the polarization plane holding optical fibers 20, 21 being coincident with the polarization directions of the alignment light f1, f2. The alignment light f1, f2 divided by the division polarization optical element 13 are respectively condensed on cores of the polarization plane holding fibers 20, 21 by condensing lenses 18, 19 so as to be introduced thereinto. Numerals 14, 15 are optical isolators which are disposed at adequate positions so as to prevent the reflection light of the alignment light from the surfaces of the optical fibers 20, 21 from returning to the laser tube. Here, the diameters of the cores of the optical fibers 20, 21 are extremely small and therefore there is the possibility that the spot of the alignment light condensed by the light source optical system 2 is shifted in position so as to lower the coupling efficiency to the optical fibers 20, 21. Thus, the light source optical system 2 is required to be constructed so as to have a high rigidity and a small dimension.

Figure 2:
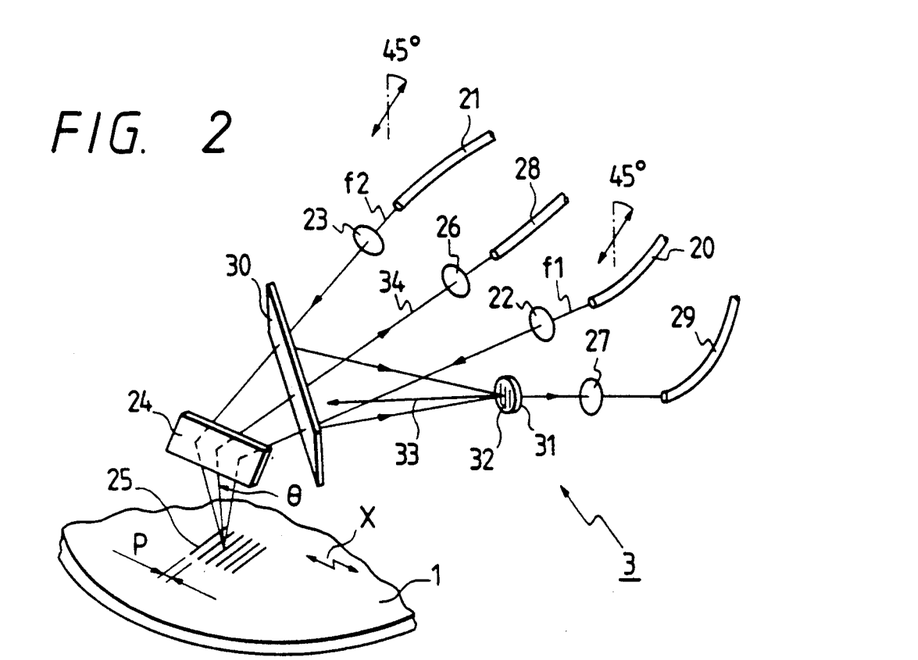
FIG. 2 is an illustration of a positional deviation detecting optical system of an alignment apparatus according to a first embodiment of the present invention.

The alignment light f1 and f2 incident on the polarization plane holding optical fibers 20, 21 are respectively directed toward the positional deviation detecting optical system 3 with the polarization direction being kept as it is. First, the alignment light f1, f2 outgone from the optical fibers 20, 21 are respectively incident on collimator lenses 22, 23 to be converted into collimated light beams. Here, the collimator lenses 22, 23 are required to arranged such that the outgoing light has a sufficiently high wave front accuracy and further arranged to be small in dimension. As such a lens it is preferable to use a refraction index distribution type lens (GRIN lens) or an aspherical lens. The alignment light f1, f2 collimated by the collimator lenses 22, 23 are respectively led to a mirror 24 so as to be downwardly directed to an alignment mark 25 comprising a diffraction grating disposed on the wafer 1. The incident angle $\theta$ of the alignment light f1, f2 on the wafer 1 surface is set as shown in the following equation (1) where the pitch of the diffraction grating of the alignment mark 25 on the wafer 1 is taken to be P and the wavelength of the alignment light is taken as $\lambda$.

$$\theta = \sin^{-1}(\lambda/P) \tag{1}$$

In the case of being incident thereon with such an incident angle $\theta$, the alignment light f1, f2 diffracted by the diffraction grating 25 respectively advance upwardly. Here, the electric field strengths E1, E2 of the alignment light f1, f2 are respectively expressed in accordance with the following equations (2) and (3).

$$E1 = A1 \cdot \cos(\omega 1 \cdot t + 2\pi x/P + \phi 1) \tag{2}$$

$$E2 = A2 \cdot \cos(\omega 2 \cdot t - 2\pi x/P + \phi 2) \tag{3}$$

where $\omega 1$, $\omega 2$ represent angular velocities of the alignment light f1, f2 and $\phi 1$, $\phi 2$ denote phase lags corresponding to the optical path length with respect to the alignment light f1, f2 in the polarization plane holding optical fibers 20, 21.

Since advancing in the same direction, the alignment light f1, f2 interfere with each other, thereby generating beat light whose light intensity Is varies at a frequency of (f1−f2) as expressed in the following equation (4).

$$Is = (E1+E2)^2 = A1^2 + A2^2 + 2A1\cdot\cos((\omega 1 - \omega 2)t + 4\pi x/P + (\phi 1 - \phi 2)) \tag{4}$$

This beat light is introduced through a collimator lens 26 into the multi-mode optical fiber 28 so that the positional deviation amount of the wafer 1 is detected on the basis of the beat light. The reason for using the multi-mode optical fibers 28, 29 is that the multi-mode fiber has a great core system to thereby eliminating the influence of the positional deviation in re-coupling the alignment light and further that the holding of the wave front is not required because the alignment light f1, f2 interfere with each other.

Here, the optical length of the optical fiber greatly varies in accordance with temperature and stress. For example, when the temperature increases by 1° C., the optical path length of the optical fiber having a length of 1 m varies by an amount corresponding to 10 to 20 wavelengths. In addition, when the pressure to be applied to the optical fiber having a length of 1 m varies by 1 Pa, the optical path length varies by amount corresponding to $10^{-6}$ to $10^{-5}$ wavelength. That is, even if a difference between the environmental conditions for the polarization plane holding optical fibers 20, 21 slightly occurs, the ($\phi 1 - \phi 2$) in the above-mentioned equations (2) and (3) varies whereby an error occurs in the positional deviation detection. Thus, a beam sampler 30 is additionally provided in order to measure ($\phi 1 - \phi 2$). The alignment light f1, f2 from the mirror 24 are partially divided by the beam sampler 30 so as to be led onto a diffraction grating 32 which is placed on a glass plate 31 and which is arranged to have a pitch equal to that of the wafer 1. The diffraction grating 32 on the glass plate 31 is fixed whereby reference beat light occurs. The intensity Ir of this beat light can be expressed by the following equation (5).

$$Ir = A1^2 + A2^2 + 2A1\cdot A2\cdot\cos((\omega 1 - \omega 2)t + (\phi 1 - \phi 2)) \tag{5}$$

As well as the signal light, this beat light is also introduced through a collimator lens 27 into the multi-mode optical fiber 29.

Here, the glass plate 31 on which the diffraction grating 32 is formed is required to be placed obliquely with respect to the alignment light. This is for the fact that the diffracted light occurs not only in the transmitting direction but also in the reflecting direction. In addition, if the glass plate 31 is placed to be perpendicular to the alignment light, the reflection diffracted light designated at numeral 33 is mixed with the reflection diffracted light from the wafer 1, thereby providing the possibility that the positional deviation detecting accuracy deteriorated. In place of the glass plate 31 it is possible to use a half-mirror whereby the alignment light f1, f2 interfere with each other.

The diffraction grating 25 on the wafer 1 varies in variety in accordance with processes effected with respect to the wafer 1. Generally, it is formed with a resist which is transparent with respect to the alignment light being applied on an irregular surface of a semiconductor member and it acts as an optical multilayer film with respect to the alignment light. Since the action of the optical multilayer film varies sensitively in accordance with the polarizing direction of light, even if the alignment light f1, f2 are inclined in either the P-polarization (polarization within the incident plane) or the S-polarization (polarization perpendicular to the incident plane) with respect to the wafer 1, there is a disadvantage that the alignment light f1, f2 tend to be affected by the surface state of the wafer 1. Thus, the polarization plane holding optical fibers 20, 21 are fixed so that the polarization direction is inclined by 45° at the exit of the optical fibers 20, 21, whereby the ratio of the P-polarization and the S-polarization becomes 5:5 on the wafer 1 surface to minimize the bad influence due to the state of the wafer 1.

Here, assuming that the wafer 1 surface is irregular due to the aluminium patterns and others, the speckle from the aluminium pattern can be included in the diffracted alignment light (diffracted light) 34. FIG. 5 shows a light pattern on the focal plane (the multi-mode optical fiber 28 surface) when the collimator lens 26 receives such diffracted light 34. As obvious from FIG. 5, the core 35 of the multi-mode optical fiber 28 disposed at the central portion can receive the alignment light 34 from which the speckle light 36 is eliminated. That is, the collimator lens 26 and the core 35 act as a spatial filter for the alignment light 34.

Figure 6:
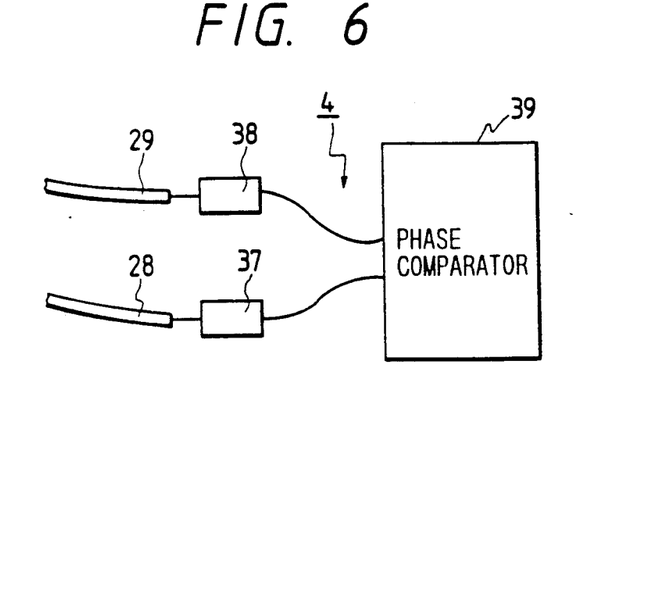
FIG. 6 shows an arrangement of a light-receiving system in the first embodiment.

Further, a description will be made hereinbelow with reference to FIG. 6 in terms of the light-receiving optical system 4. In the light-receiving optical system 4, the alignment light transferred through the multi-mode optical fibers 28, 29 are respectively led to photodetectors 37, 38 such as photomultiplier so as to be converted into the corresponding electric signals. The electric signals outputted from the photodetectors 37, 38 are supplied to a phase comparator 39 to detect a difference in phase between the two electric signals so as to obtain an output proportional to the positional deviation x of the wafer 1 as shown in the following equation (6) based upon the above-mentioned equations (4) and (5).

$$(\text{phase of Is}) - (\text{phase of Ir}) = 4\pi x/P \qquad (6).$$

Accordingly, with a wafer stage designated at numeral 40 being moved on the basis of the output of the phase comparator 39 so that the positional deviation becomes zero, it is possible to eliminate the positional deviation of the wafer 1 relative to the projection lens 7.

As described above, according to this embodiment, the alignment light from the light source optical system 2 disposed at a position separated from a body of the exposure apparatus are respectively led through the optical fibers 20, 21 to the positional deviation detecting optical system 3 placed directly under the projection lens 7 so as to be applied onto the alignment mark 25 of the wafer 1 so that the diffracted light 34 from the wafer 1 are supplied through the optical fibers 28, 29 to the light-receiving optical system 4 where the beat light including the positional deviation information of the wafer 1 are converted into electric signals by the photodetectors 37, 38 and the positional deviation amount of the wafer 1 is detected by the phase comparator 39 to move the wafer stage 40 in accordance with the positional deviation amount to control the positional deviation amount to zero, thereby accurately effecting the alignment of the wafer 1 with respect to the projection lens 7.

In addition, according to this invention, since the light source optical system 2 and the light-receiving optical system 4 are arranged to be separated from the positional deviation detecting optical system 3 by means of the optical fibers 20, 21, 28 and 29, it is possible to reduce the size of the positional deviation detecting optical system 3 and further to separate the laser light source 12 from the delicate portions of the apparatus. The size-reduction of the positional deviation detecting optical system 3 increases the degree of freedom in terms of the configuration (arrangement) of the optical system 3 within the exposure apparatus whereby the optical system 3 can be disposed at an extremely narrow place between the projection lens 7 and the wafer 1. This not only allows the alignment at a place extremely close to the exposure position but also permits minimizing the influence of atmosphere which is the largest cause to produce the detection error in the laser interference measurement. Further, with the diffraction grating 32 being provided in the positional deviation detecting optical system 3 to make compact the entire arrangement of the optical system 3, it is possible to realize the optical system which is bearable against disturbances such as vibration. Still further, since the heat due to the laser light source 12 is arranged so as not to be conveyed to the other portions of the exposure apparatus, it is possible to prevent deformation due to the heat to ensure the stable alignment operation. Moreover, since the alignment system is constructed with the optical fibers having extremely high flexibility being used as light guide passages, it is possible to easily mount them on the apparatus and easily adjust the optical axes and further to use the apparatus for the other purposes.

Secondly, a description will be made hereinbelow in terms of an exposure apparatus according to a second embodiment of this invention. Although in the above-described first embodiment the alignment (offaxis alignment) is effected with the alignment place being extremely close to the exposure place, in the second embodiment the alignment (onaxis alignment) is effected with the alignment place being the same as the exposure place. FIGS. 7 to 12 are illustrations for describing the second embodiment where parts corresponding to those in FIGS. 1 to 6 are marked with the same numerals and characters.

Figure 7:
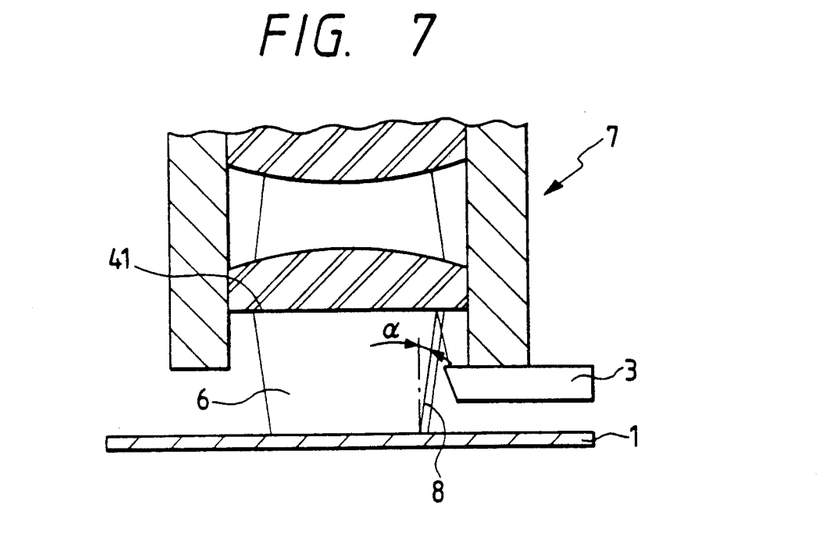
FIG. 7 shows an arrangement for effecting an OnAxis alignment according to a second embodiment of this invention.

One important point for effecting the onaxis alignment is to introduce the alignment light into the exposure light beam. Generally, the alignment light is introduced into the exposure light by means of a dichroic mirror or the like on the basis of the difference in wavelength between the alignment light and the exposure light. However, in the case that the positional deviation detecting optical system 3 is disposed at the extremely narrow space between the projection lens 7 and the wafer 1, it is impossible to use the dichroic mirror. Thus, in the second embodiment, as shown in FIG. 7, a coating surface 41 which is the lowermost surface of the projection lens 7 designed and manufactured only for the exposure light is used in place of the dichroic mirror. The coating surface 41 is arranged to have a transmission efficiency of about 100% with respect to the exposure light and have an extremely low transmission efficiency with respect to the alignment light. That is, the coating surface 41 comprises a surface having a great curvature to substantially act as a reflection surface for the alignment light 8.

Figure 8:
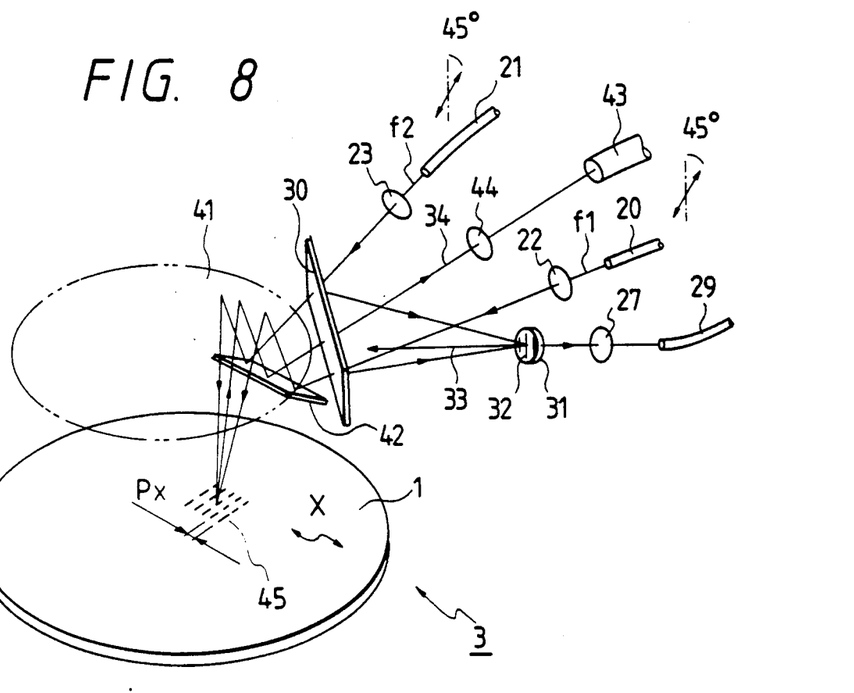
FIG. 8 illustrates a positional deviation detecting optical system of an alignment apparatus according to the second embodiment of this invention.
Figure 11:
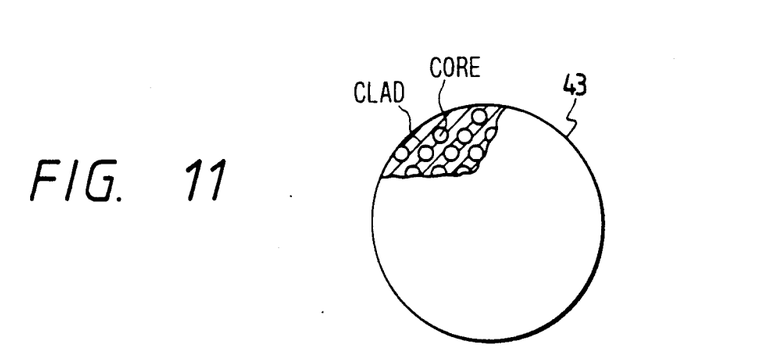
FIG. 11 is a partially broken diagram showing a structure of an image transmitting optical fiber to be used in the second embodiment.

In the second embodiment, the light source optical system 2 has the same structure and function as the optical system 2 shown in FIG. 3 and the positional deviation detecting optical system 3 is arranged as shown in FIG. 8. The differences from the above-described first embodiment are that an image-forming lens 44 is provided in place of the collimator lens 26, an image transmitting optical fiber 43 is provided in place of the multi-mode optical fiber 28, and a returning mirror 42 is disposed in place of the mirror 24. The image-forming lens 44 is for forming the image of an alignment mark (diffraction grating) 45 of the wafer 1 on the image transmitting optical fiber 43 surface, and a GRIN lens or a small-sized spherical/aspherical lens can be used as the image-transmitting lens 44. The image transmitting optical fiber 43 is a melted and integrated optical fiber in which a number of cores are arranged to hold the clad in common as illustrated in FIG. 11. The image transmitting optical fiber 43 can transmit the image on its incident end surface to its outgoing end surface as it is. Thus, a combination of the image-forming lens 44 and the image transmitting optical fiber 43 can reproduce the state of the alignment mark 45 of the wafer 1 in the light-receiving optical system 4. Further, the mirror 42 is for directing the alignment light from the positional deviation detecting optical system 3 toward the coating surface 41 of the projection lens 7 and for again directing to the positional deviation detecting optical system 3 the diffracted light reflected from the alignment mark 45 of the wafer 1 and reflected from the coating surface 41.

Figure 10:
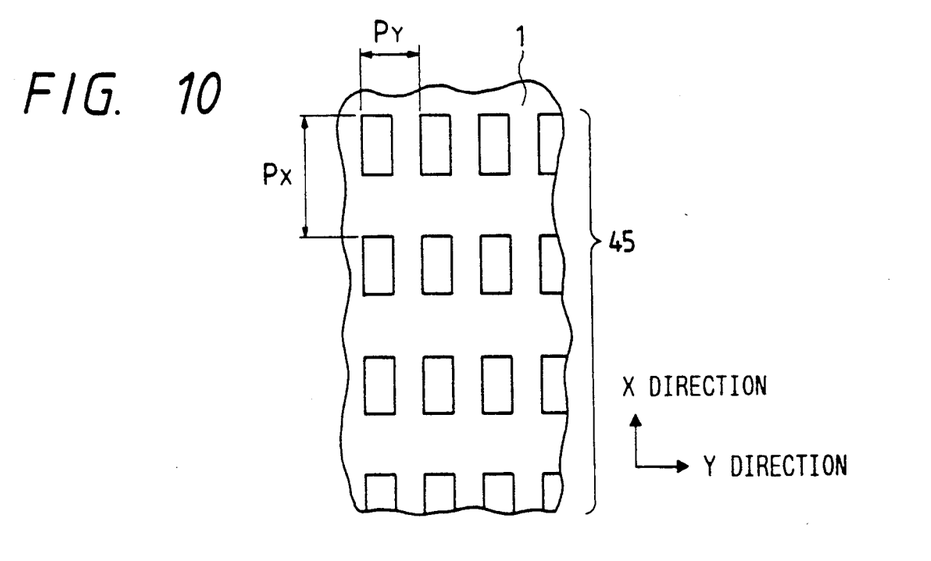
FIG. 10 is an illustration of an alignment mark comprising a two-dimensional arranged diffraction gratings in the second embodiment.

The alignment light outgone upwardly by the mirror 42 is reflected on the coating surface 41 so as to be introduced into the exposure light 6. As shown in FIG. 10, the alignment mark 45 is a two-dimensional diffraction grating where diffraction grating elements are arranged (overlapped) in X and Y directions. The X-direction diffraction pattern is for detecting the positional deviation and the Y-direction diffraction pattern is for causing the obliquely incident alignment light to be diffracted obliquely at an angle equal to the incident angle. For example, in FIG. 7, when the incident angle of the alignment light 8 relative to the wafer 1 is α, the pitch Py in the Y direction is determined in accordance with the following equation (7).

$$2P_y \cdot \sin \alpha = n\lambda (n = 1, 2, \ldots) \qquad (7).$$

Due to the Y-direction diffraction pattern, the alignment light 8 can again be returned to the positional deviation detecting optical system 3 after being diffracted on the wafer 1.

Figure 9:
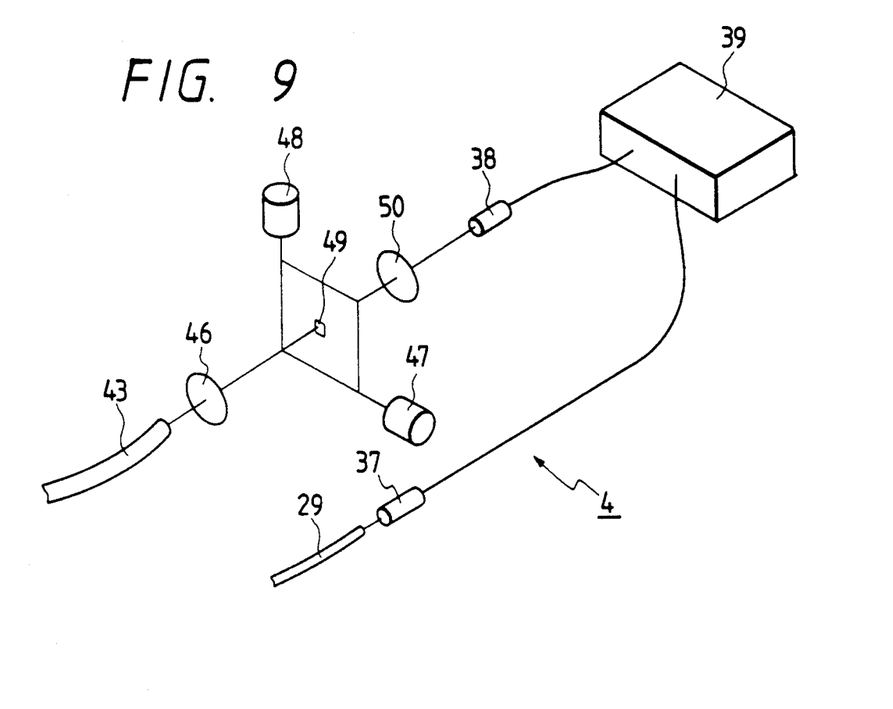
FIG. 9 shows an arrangement of a light-receiving optical system of an alignment apparatus according to the second embodiment.
Figure 12:
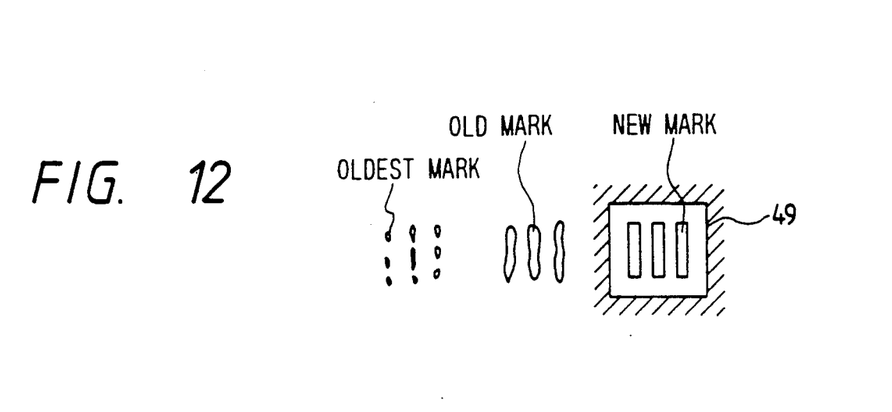
FIG. 12 is an illustration for describing the updating of an alignment mark in the second embodiment.

Secondly, the light-receiving optical system 4 will be described hereinbelow with reference to FIG. 9. In FIG. 9, the image at the outgoing end of the image transmitting optical fiber 43 is enlarged by an enlarging lens 46. At the outgoing side of the enlarging lens 46 there is provided an aperture 49 which is two-dimensionally driven by actuators 47, 48. The aperture 49 derives the alignment light only from the alignment mark 45 to supplies it to an condensing lens 50 so that the alignment light is incident on a photodetector 38. FIG. 12 shows this state. That is, of the light from three alignment marks, only the light from the new alignment mark (the right side alignment mark in the illustration) existing at a given position is selected by the aperture 49 and then received by the photodetector 38 and, on the other hand, the light from the old alignment marks are not received by the photodetector 38.

An advantage of such an arrangement of the light-receiving optical system 4 is as follows. That is, since the alignment mark is gradually damaged in accordance with the process effected for the wafer, the alignment mark is required to be successively renewed. In the case of the onaxis alignment, the exposure position is the alignment position and hence the position of the alignment mark 45 is shifted with respect to the positional deviation detecting optical system 3 at the time of the alignment. Thus, even if the position thereof is changed, with the aperture 49 being moved, it is possible to detect only the alignment light from the new alignment mark to maintain the high detection accuracy irrespective of the updating of the alignment mark. FIG. 12 also shows the state that the old alignment marks are disconnected from the light-receiving optical system 4.

In addition to the advantages of the first embodiment, the above-described second embodiment can provide an advantage to allow the alignment during the exposure process. Accordingly, the wafer 1 is accurately aligned with respect to the projection lens 7 when reaching the exposure position, and therefore it is possible to constitute an exposure apparatus in which the pattern overlapping accuracy is not affected by the operation accuracy of the wafer stage 40.

Figure 13:
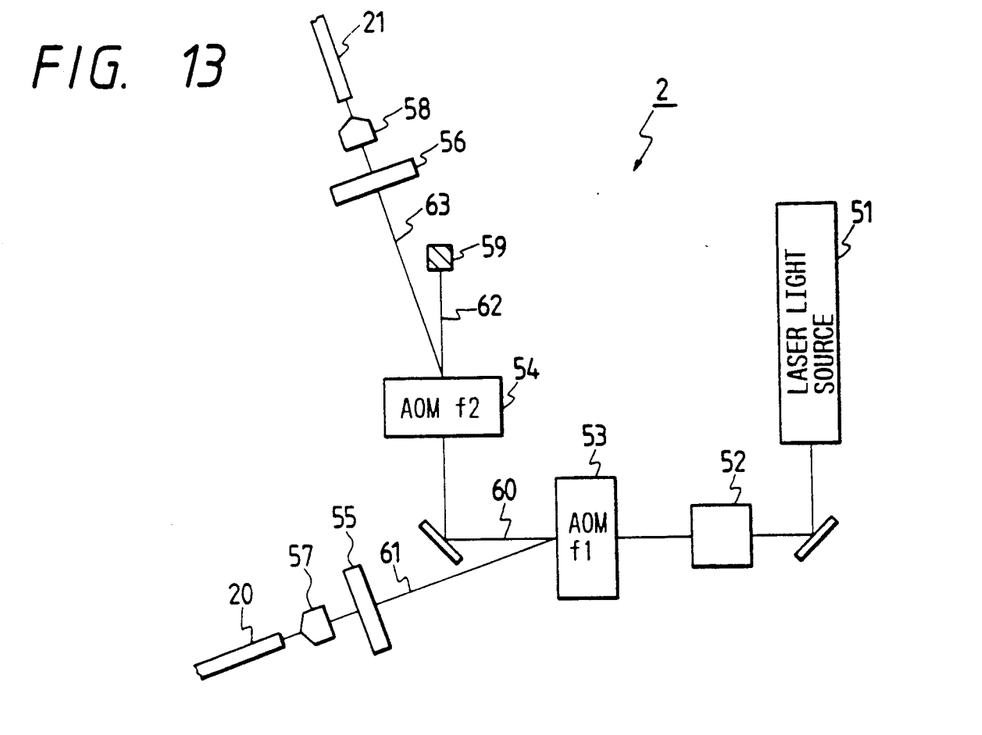
FIG. 13 is a schematic illustration of an arrangement of a light source optical system of an alignment apparatus according to a third embodiment of this invention.

Further, a description will be made hereinbelow with reference to FIG. 13 in terms of a third embodiment of this invention. One difference between this third embodiment and the above-described first or second embodiment is the arrangement of the light source optical system 2. In FIG. 13, numeral 51 represents a laser light source for generating linear polarization coherent light having a single frequency (cycle), 52 depicts an isolator, 53, 54 designate acoustic optical modulators (AOM) using an ultrasonic wave, 55, 56 denote $\frac{1}{2}\lambda$ wave plates, 57, 58 are condensing lenses, 59 indicates a beam stopper, and 20, 21 are polarization plane holding optical fibers for coupling the light source optical system 2 to the positional deviation detecting optical system 3.

The coherent light emitted from the light source 51 passes through the isolator 52 and then reaches the first acoustic optical modulator 53 so as to be separated into non-modulated zero-order diffracted light 60 and modulated first-order diffracted light 61. The first-order diffracted light 61 passes through the $\frac{1}{2}\lambda$ wave plate 55 and then reaches the condensing lens 57 so as to be coupled to the polarization plane holding optical fiber 20. On the other hand, the non-modulated zero-order diffracted light 60 is incident on the second acoustic optical modulator 54 so as to be separated into non-modulated zero-order diffracted light 62 and modulated first-order diffracted light 63. The zero-order diffracted light 62 is blocked by the beam stopper 59, and the first-order diffracted light 63 passes through the $\frac{1}{2}\lambda$ wave plate 56 so as to be coupled through the condensing lens 58 to the polarization plane holding optical fiber 21. Here, the isolator 52 is provided in order to prevent the laser light source 51 from becoming unstable due to light reflected from the respective optical element surfaces and returned to the laser light source 51. The $\frac{1}{2}\lambda$ wave plates 55, 56 are inserted in the optical paths for the planes of polarization of the first-order diffracted light 61, 63 being coincident with the planes of polarization of the optical fibers 20, 21 as well as the above-described first embodiment.

Figure 14:
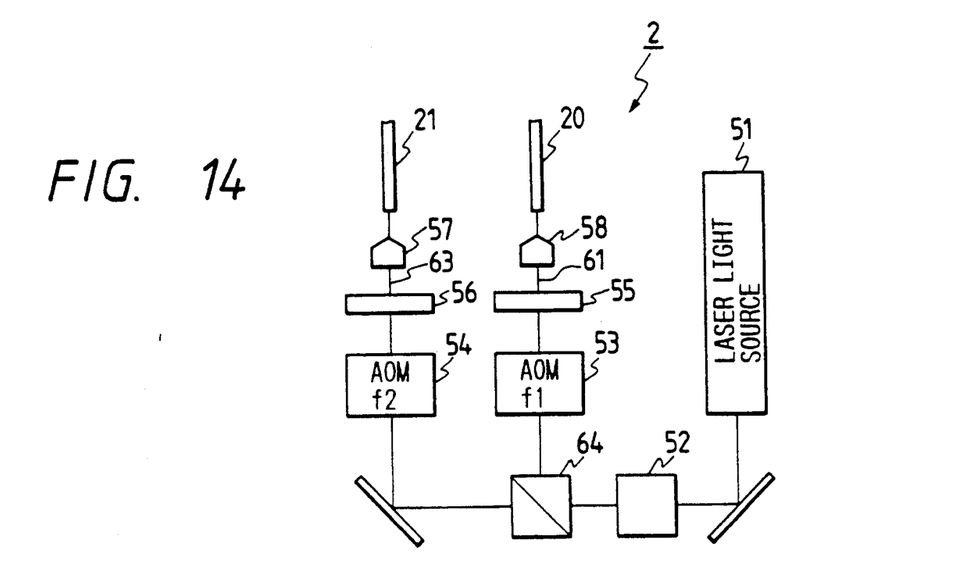
FIG. 14 shows another arrangement of a light source optical system of an alignment apparatus according to the third embodiment.

Unlike the light source optical system 2 shown in FIG. 3, in the light source optical system 2 according to this embodiment, the laser light source 51 is arranged to generate light having a single frequency, and therefore it is possible to completely eliminate the problem that the positional deviation detecting accuracy is lowered due to the mixing of the two frequencies which can occur in the above-described embodiments. In addition, with the two acoustic optical modulators 53, 54 being disposed in series on one optical axis without dividing the coherent light, it is possible to increase the rate of a portion of the coherent light which can be used as the alignment light. That is, it is also appropriate that in the light source optical system 2 the light from the laser light source 51 is first divided by a beam splitter 64 into two beams and then modulated by the acoustic optical modulators 53, 54 as illustrated in FIG. 14. However, in this case, when the intensity ratios of the first-order diffracted light 61, 63 due to the acoustic optical modulators 53, 54 relative to the incident light are respectively taken to be P1 and P2, the rate of the portion of the coherent light from the laser light source 51 which portion can be used as the alignment light becomes as expressed by the following equation (8).

$$(P1 + P2)/2 \tag{8}$$

On the other hand, in the case of using the light source optical system 2 as illustrated in FIG. 13, the rate of the light which can be used as the alignment light becomes as expressed by the following equation (9).

$$P1 + (1 - P1) \cdot P2 \tag{9}$$

As obvious from the above two equations (8) and (9), when using the light source optical system 2 of FIG. 13, it is possible to gain the light quantity expressed by the following equation (10).

$$\tfrac{1}{2} \cdot (P1 + P2) - P1 \cdot P2 > 0 \tag{10}$$

Moreover, although the exposure apparatus generally requires a plurality of alignment devices, according to this embodiment, in the case that the intensity of the alignment light from the laser light source 51 is strong, the alignment light can be divided on the way so that the alignment light from one light source are supplied to the plurality of alignment devices, thereby reducing the number of the light sources which act as the heat sources.

Furthermore, since the intensity of the diffracted light generally depends upon the frequency for the acoustic optical modulators 53, 54, for obtaining beat light having a high contrast, the acoustic optical modulators 53, 54 are required to be disposed so that the intensities of the two alignment light substantially become equal to each other. According to the arrangement shown in FIG. 14 the intensity difference between the diffracted light directly corresponds to the intensity difference between the alignment light, while according to the arrangement shown in FIG. 13 the intensity difference between the alignment light can be reduced with the acoustic optical modulator 53 providing a lower intensity being provided at an upstream side (light source side). Still further, according to the third embodiment, it is possible to obtain high contrast beat light to improve the alignment accuracy between the wafer 1 and the projection lens 7 concurrently reducing the number of the elements constituting the optical system.

Figure 15:
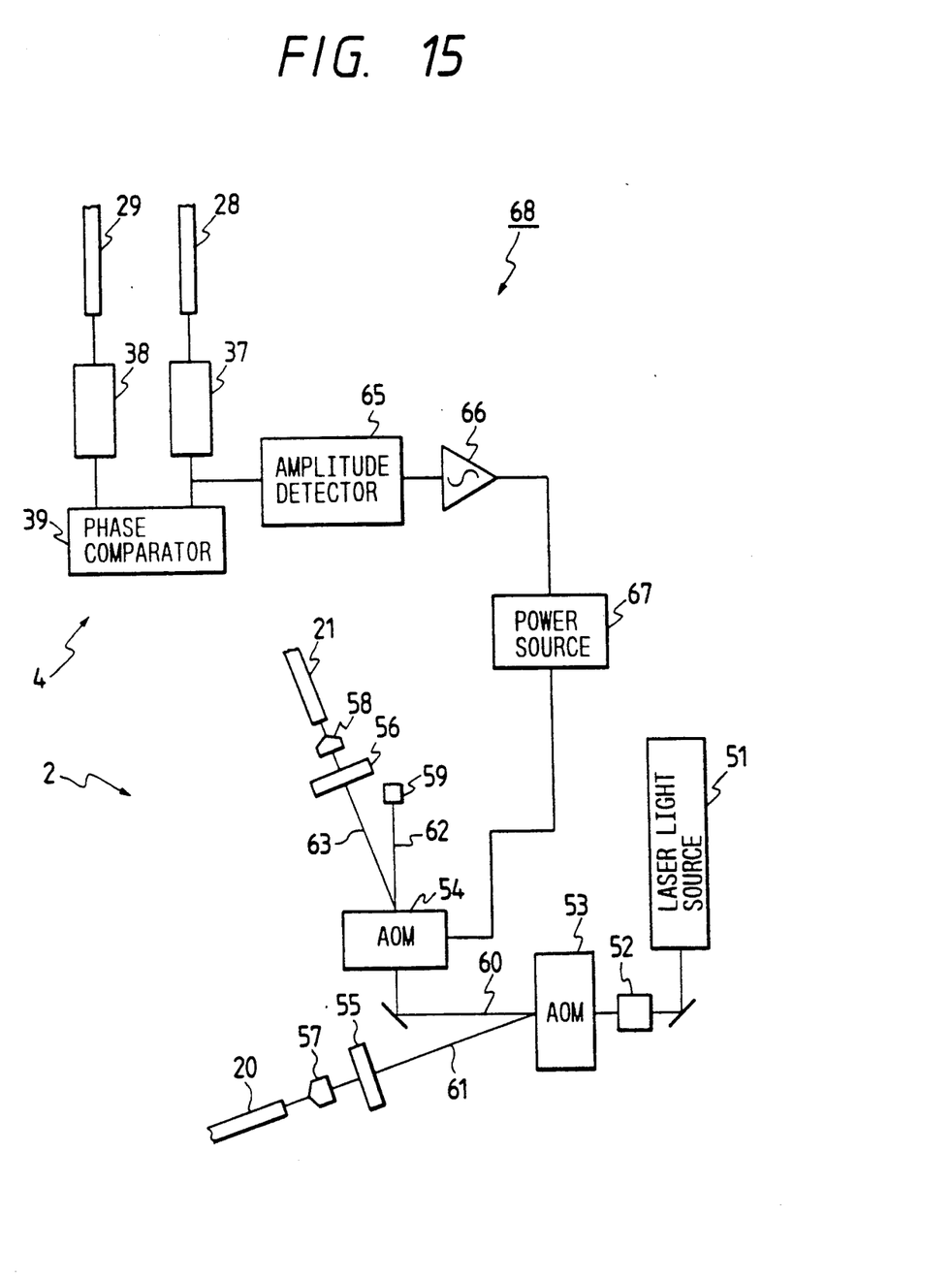
FIG. 15 shows an arrangement of an alignment apparatus according to a fourth embodiment of the present invention.

A fourth embodiment of this invention will be described hereinbelow with reference to FIG. 15. In the fourth embodiment the light source optical system 2 has the same structure as the light source optical system shown in FIG. 13. It is also appropriate to use the light source optical system 2 illustrated in FIG. 14. Further, in the fourth embodiment the light-receiving optical system 4 has the same structure as the light-receiving optical system 4 shown in FIG. 6. It is also appropriate to use the light-receiving optical system 4 illustrated in FIG. 8.

In FIG. 5, numeral 65 represents a beat signal amplitude detector to which the output of the photodetector 37 of the light-receiving optical system 4 is inputted, 66 depicts a comparison and decision device for generating a control signal whereby the amplitude of the beat signal becomes constant, and 67 denotes a power source for the acoustic optical modulator 54 disposed at a downstream side of the acoustic optical modulator 53, the power source 67 being responsive to the control signal of the comparison and decision device 66. These devices 65 to 67 constitute an alignment light intensity control system 68. Here, it is also appropriate that in place of the output of the photodetector 37 the output of the photodetector 38 is inputted to the beat signal amplitude detector 65.

As described in the first embodiment, the intensities of the alignment light outgone from the polarization plane holding fibers 20, 21 are affected by the surrounding environment so as to become unstable in amplitude and phase to thereby deteriorate the positional deviation detecting accuracy in the light-receiving optical system 4. Thus, according to this embodiment, the beat signal amplitude detector 65 detects the amplitude of the beat signal outputted from photodetector 37 of the light-receiving optical system 4 to effect the feedback to the power source 67 which supplies an electric power to the downstream-side acoustic optical modulator 54 so that the amplitude thereof becomes constant. With this feedback, it is possible to eliminate the influence of the environment variation and others at all the portions from the light source optical system 2 to the light-receiving optical system 4 to thereby prevent the positional deviation detecting accuracy from being deteriorated due to the variation of the beat signal.

In the acoustic optical modulators 53, 54, compression waves are produced in the insides of the optical members due to an ultrasonic oscillator for generating a single frequency, and hence the coherent light incident on the acoustic optical modulators 53, 54 are diffracted by the refraction index distribution due to the compression waves. Since the compression waves due to the ultrasonic oscillator are progressive waves, the diffracted light is subjected to one Doppler effect so as to be frequency-modulated in correspondence with the frequency of the ultrasonic oscillator. In the case that the frequency is constant, the diffracted light intensity is a function of the energy to be applied to the ultrasonic oscillator, and therefore the diffracted light intensity is controllable in accordance with the electric energy (power amount) to be fed to the ultrasonic oscillator.

Here, as another method of controlling the alignment quantity by the feedback, it is also appropriate that, in the light source optical system 2 shown in FIG. 14, the intensities of the alignment light outgone from the polarization plane holding optical fibers 20, 21 are arranged to be measured to effect the feedback to the power source for the respective acoustic optical modulators 53, 54 so that the respective alignment light intensities always become constant.

According to the fourth embodiment, in addition to the advantages of the first to third embodiments, the alignment light intensity control system 68 can remove the variation of the alignment light intensity due to the environment variation and others occurring at all the portions from the light source optical system 2 up to the light-receiving optical system 4 to prevent the positional deviation detecting accuracy from being deteriorated due to the strength variation of the beat signal.

It should be understood that the foregoing relates to only preferred embodiments of the present invention, and that it is intended to cover all changes and modifications of the embodiments of the invention herein used for the purposes of the disclosure, which do not constitute departures from the spirit and scope of the invention.

What is claimed is:

1. An alignment apparatus for aligning an object at a predetermined position to project exposure light onto said object through a projection lens positioned above said object, comprising:
    a light source optical system for emitting coherent alignment light, the light source optical system being positioned at a distance away from an object;
    a first optical system for leading said alignment light emitted from said light source optical system toward said object through a first flexible light guide passage while bypassing a projection lens;
    a positional deviation detecting optical system placed between said projection lens and said object for projecting said coherent alignment light directed through said first flexible light guide passage of said first optical system onto an alignment mark formed on said object to transform said coherent alignment light to beat light in which positional deviation information of said object is included, and detecting said beat light;
    a second optical system for leading said beat light detected in said positional deviation detecting optical system away from said object through a second flexible light guide passage while bypassing said projection lens;
    a light-receiving optical system positioned at a distance from said object for receiving said beat light lead through said second flexible light guide passage of said second optic system to detect an amount of the positional deviation of said object included in said beat light; and
    moving means for moving said object on the basis of the positional deviation amount detected by said light-receiving optical system to align said object at the predetermined position.

2. An alignment apparatus as claimed in claim 1, wherein said first flexible light guide passage of said first optical system is a polarization plane holding optical fiber for holding a polarization direction of said alignment light and said second flexible light guide passage of said second optical system is a multi-mode optical fiber having a core diameter which is greater than that of said polarization plane holding optical fiber.

3. An alignment apparatus as claimed in claim 1, wherein said first flexible light guide passage of said first optical system is a polarization plane holding optical fiber for holding a polarization direction of said alignment light and said second flexible light guide passage of said second optical system is an image transmitting optical fiber for inputting an image indicated by said beat light at an incident end face of said image transmitting optical fiber and for transmitting said image to an outgoing end face of said image transmitting optical fiber.

4. An exposure apparatus for exposing a wafer to exposure light to transfer a pattern to said wafer, comprising:
    an exposure light source for emitting a exposure light;
    a reticle on which pattern is formed, said reticle being illuminated with said exposure light emitted from said exposure light source, so that exposure light reflected from said reticle reflects said pattern of said reticle;
    a projection optical system for projecting said exposure light reflected from said reticle onto a wafer to form an image corresponding to said pattern of said reticle on said wafer, said projection optical system being positioned above said wafer;
    a light source optical system separated from said exposure light source for emitting coherent alignment light, the light source optical system being positioned at a distance from the water;
    a first optical system for leading said coherent alignment light emitted from said light source optical system toward said wafer through a first flexible light guide passage while bypassing said projection optical system and said reticle;
    a positional deviation detecting optical system for projecting said coherent alignment light directed through said first flexible light guide passage of said first optical system onto an alignment mark formed on said wafer to transform said coherent alignment light to beat light in which positional deviation information of said wafer is included, and for detecting said beat light, said positional deviation detecting optical system being disposed between said projection optical system and said wafer;
    a second optical system for directing said beat light detected in said positional deviation detecting optical system at a distance from said wafer through a second flexible light guide passage while passing through an outside of said projection lens and an outside of said reticle;
    a light-receiving optical system positioned at a distance from said wafer for receiving said beat light directed through said second flexible light guide passage of said second optical system to detect an amount of the positional deviation of said wafer included in said beat light; and
    moving means for moving said wafer on the basis of the positional deviation amount detected by said light-receiving optical system to align said wafer with said reticle, said pattern of said reticle being transferred to an image-formation area of said wafer moved by said moving means.

5. An apparatus as claimed in claim 4, wherein said image-formation of said wager onto which said exposure light is projected in said projection optical system is separated from said alignment mark of said wafer onto which said alignment light is projected in said positional deviation detecting optical system.

6. An apparatus as claimed in claim 4, wherein said first flexible light guide passage of said first optical system is a polarization plane holding optical fiber for holding a polarization direction of said alignment light and said second flexible light guide passage of said second optical system is a multi-mode optical fiber having a core diameter which is great than that of said polarization plane holding optical fiber.

7. An apparatus as claimed in claim 6, wherein said positional deviation detecting optical system comprises optical path length variation detecting means for detecting a variation of an optical path length of said polarization plane holding optical fiber, the variation being caused by fluctuation of ambient temperature of said polarization plane holding optical fiber or by pressure applied to said polarization plane holding optical fiber.

8. An apparatus as claimed in claim 7, wherein said optical path length variation detecting means includes beam sampling means disposed at an oblique incident angle with respect to an optical path of said alignment light directed through said polarization plane holding fiber for sampling said alignment light and reference beat light obtaining means disposed at an oblique incident angle with respect to an optical path of the sampled alignment light for obtaining reference beat light from said alignment light.

9. An apparatus as claimed in claim 4, wherein a portion of said image-formation area of said wafer onto which said exposure light is projected in said projection optical system overlaps with said alignment mark of said wafer onto which said alignment light is projected in said positional deviation detecting optical system.

10. An apparatus as claimed in claim 8, wherein said alignment light outgone from said positional deviation detecting optical system is arranged to be reflected on a surface of said projection optical system facing said wafer before being directed to said wafer.

11. An apparatus as claimed in claim 4, wherein said first flexible light guide passage of said first optical system is a polarization plane holding optical fiber for holding a polarization direction of said alignment light and said second flexible light guide passage of said second optical system is an image transmitting optical fiber for inputting one or more alignment mark images indicated by said beat light at an incident end face of said image transmitting optical fiber and transmitting said alignment mark image to an outgoing end face of said image transmitting optical fiber.

12. An apparatus as claimed in claim 11, further comprising selection means for selecting said alignment mark image indicated by said beat light projected from said image transmitting optical fiber from among various alignment mark images, a portion of said image-formation area of said wafer onto which said exposure light is projected in said projection optical system overlaps with an alignment mark area of said wafer onto which said alignment light is projected to form said various alignment mark image in said positional deviation detecting optical system.

13. An apparatus as claimed in claim 12, wherein said selection means comprises an aperture disposed between said image transmitting optical fiber and said light-receiving optical system, said aperture being arranged to be movable in a direction crossing said alignment light outgone from said image transmitting fiber.

14. An apparatus as claimed in claim 4, wherein said light source optical system comprises a light source for generating the coherent alignment light having two different frequencies and oscillating directions and a polarization optical element for branching the two frequency coherent alignment light generated by said light source into a first coherent alignment light having a first frequency and a first oscillating direction and a second coherent alignment light having a second frequency and a second oscillating direction, said first and second coherent alignment light being projected onto said wafer through said first flexible light guide passage of said first optical system.

15. An apparatus as claimed in claim 4, wherein said light source optical system comprises a light source for generating the coherent alignment light having one frequency and modulating means for modulating said one-frequency and modulating means for modulating said one-frequency coherent alignment light generated by said light source to first and second modulated light having two different frequencies and oscillating directions, said first and second modulated light being projected onto said wafer through said first flexible light guide passage of said first optical system.

16. An apparatus as claimed in claim 15, wherein said modulating means of said light source optical system comprises at least first and second modulating elements coupled in series to each other, said first modulating element branching said coherent alignment light into two portions to modulate one of the branched portions to provide said first modulated light having a first frequency, and said second modulating element branching the other portion branched by said first modulating element into at least two portions to modulate at least one of the branched portions to provide said second modulated light having a second frequency.

17. An apparatus as claimed in claim 15, wherein said modulating means of said light source optical system comprises branching means for branching said one-frequency coherent alignment light generated by said light source into at least two portions and first and second modulating elements coupled in parallel to each other, one of the branched portions incident on said first modulating element being modulated to said first modulating light having a first frequency and the other branched portion incident on said second modulating element being modulated to said second modulated light having a second frequency.

18. An apparatus as claimed in claim 16, wherein each of said first and second modulating elements comprises an acoustic optical element.

19. An apparatus as claimed in claim 17, wherein each of said first and second modulating elements comprises an acoustic optical element.

20. An apparatus as claimed in claim 16, wherein said light source optical system further comprises control means for controlling a first amplitude of said first modulated light modulated in said first modulating element and a second amplitude of said second modulate light modulated in said second modulating element to keep said first and second amplitude constant before or after said first and second modulated light is incident on said wafer.

21. An apparatus as claimed in claim 17, wherein said light source optical system further comprises control means for controlling a first amplitude of said first modulated light modulated in said first modulating element and a second amplitude of said second modulated light modulated in said second modulating element to keep said first and second amplitude constant before or after said first and second modulated light is incident on said wafer.

22. An apparatus as claimed in claim 20, wherein said first and second modulating elements are acoustic optical elements, and drive energy strengths of said acoustic optical elements are controlled under the control of said control means to keep said first and second amplitude constant.

23. An apparatus as claimed in claim 21, wherein said first and second modulating elements are acoustic optical elements, and drive energy strengths of said acoustic optical elements are controlled by said control means so as to keep said first and second amplitude constant.

24. An apparatus as claimed in claim 14, wherein said wafer has on its surface a diffraction grating for generating said beat light, and said first and second coherent alignment light are projected onto said diffracting grating of said wafer to incline polarization directions of said first and second coherent alignment light at an angle of 45 degrees with respect to said surface of said wafer, a ratio of parallel polarized light to a plane of incidence and perpendicularly polarized light to a plane of incidence being 5:5.

25. An apparatus as claimed in claim 15, wherein said wafer has on its surface a diffraction grating for generating said beat light, and said first and second modulated light are projected onto said diffracting grating of said water to incline polarization directions or said first and second modulated light at an angle of 45 degrees with respect to said surface of said wafer, a ratio of light parallel polarized light to a pane of incidence and perpendicularly polarized light to a plane of incidence being 5:5.

* * * * *